United States Patent
Choy et al.

(10) Patent No.: US 8,737,137 B1
(45) Date of Patent: May 27, 2014

(54) FLASH MEMORY WITH BIAS VOLTAGE FOR WORD LINE/ROW DRIVER

(71) Applicants: Jon S. Choy, Austin, TX (US); Padmaraj Sanjeevarao, Austin, TX (US)

(72) Inventors: Jon S. Choy, Austin, TX (US); Padmaraj Sanjeevarao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/747,088

(22) Filed: Jan. 22, 2013

(51) Int. Cl.
    *G11C 16/06* (2006.01)

(52) U.S. Cl.
    USPC ............ 365/185.23; 365/185.18; 365/185.25; 365/230.06

(58) Field of Classification Search
    USPC .............. 365/185.23, 185.18, 185.25, 230.06
    See application file for complete search history.

(56) References Cited

U.S. PATENT DOCUMENTS

| | | | |
|---|---|---|---|
| 5,602,784 A * | 2/1997 | Kojima et al. | 365/189.09 |
| 5,828,607 A | 10/1998 | Bushey et al. | |
| 6,044,035 A * | 3/2000 | Kohno | 365/230.06 |
| 6,064,618 A * | 5/2000 | Kuriyama et al. | 365/230.03 |
| 6,356,481 B1 | 3/2002 | Micheloni et al. | |
| 6,542,406 B2 | 4/2003 | Byeon et al. | |
| 6,621,745 B1 | 9/2003 | Manea | |
| 6,804,148 B2 | 10/2004 | Bedarida et al. | |
| 7,079,417 B2 | 7/2006 | Nam et al. | |
| 7,319,616 B2 | 1/2008 | Sundaram et al. | |

* cited by examiner

*Primary Examiner* — Connie Yoha
(74) *Attorney, Agent, or Firm* — Mary Jo Bertani; David G. Dolezal

(57) ABSTRACT

A memory device includes a word line driver circuit, a write voltage generator for providing a write voltage to the word line driver during a write operation to memory cells coupled to the word line driver circuit, and a write bias generator including an output node for providing a write bias voltage that is different from the write voltage to the word line driver circuit during a write operation to memory cells coupled to the word line driver circuit. The write bias voltage is used to reduce current drawn by the word line driver circuit from the write voltage generator during a write operation to memory cells coupled to the word line driver circuit.

21 Claims, 4 Drawing Sheets

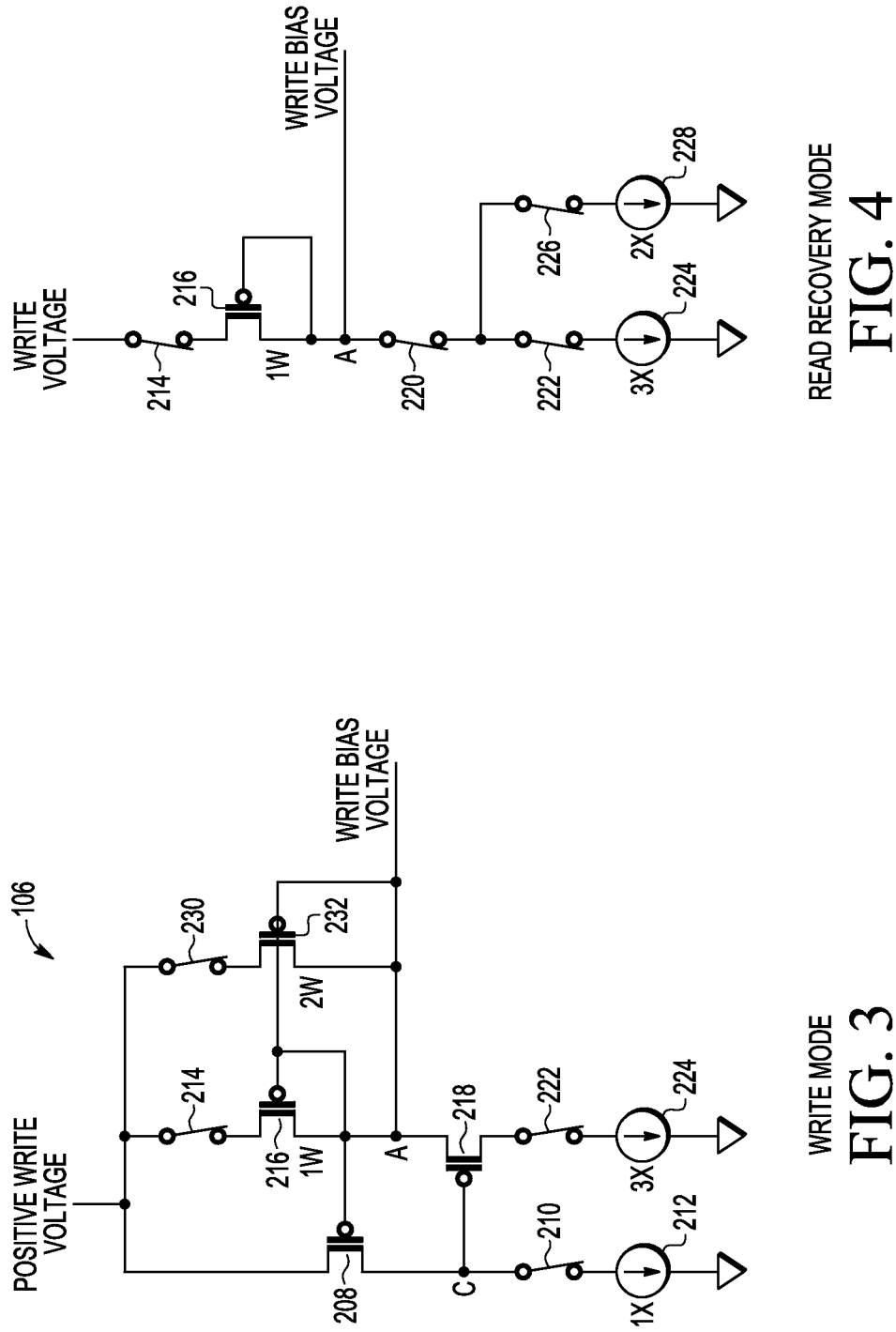

FLASH MEMORY WITH BIAS VOLTAGE FOR WORD LINE/ROW DRIVER

BACKGROUND

1. Field

This disclosure relates generally to non-volatile memory, and more specifically, to generating a voltage bias for word line/row drivers.

2. Related Art

Non-volatile memory (NVM) such as electrically-erasable programmable read-only memory (EEPROM) and flash uses different levels of voltages at first and second current terminals and control gate during read, write, erase, and write verify operations. The highest levels of voltage are typically used during write operations. The voltages in the NVM device are generated by voltage generators and are supplied to driver circuits that are coupled to selected memory cells in an array of memory cells. The driver circuits pull current against a load device. The load is limited by mirroring a bias voltage to the driver circuits. The setup time to drive the bias voltage creates a transient while the mirror requires time to stabilize the current, thereby requiring additional time to stabilize the word line voltage. It is desirable to reduce the time required to stabilize the bias voltage to increase the speed of write operations.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 3 is a schematic diagram showing a configuration of a positive write bias voltage generator circuit of FIG. 2 during a write mode of operation.

FIG. 4 is a schematic diagram showing a configuration of a positive write bias voltage generator circuit of FIG. 2 during a read recovery mode of operation.

DETAILED DESCRIPTION

Embodiments of devices and methods are disclosed that provide write bias voltage to limit current in a word line driver during write operations. The write bias voltage is used in a word line driver circuit to stabilize word line signals at a desired voltage more quickly and enable faster operation of the memory cells as a result.

Figure 1:
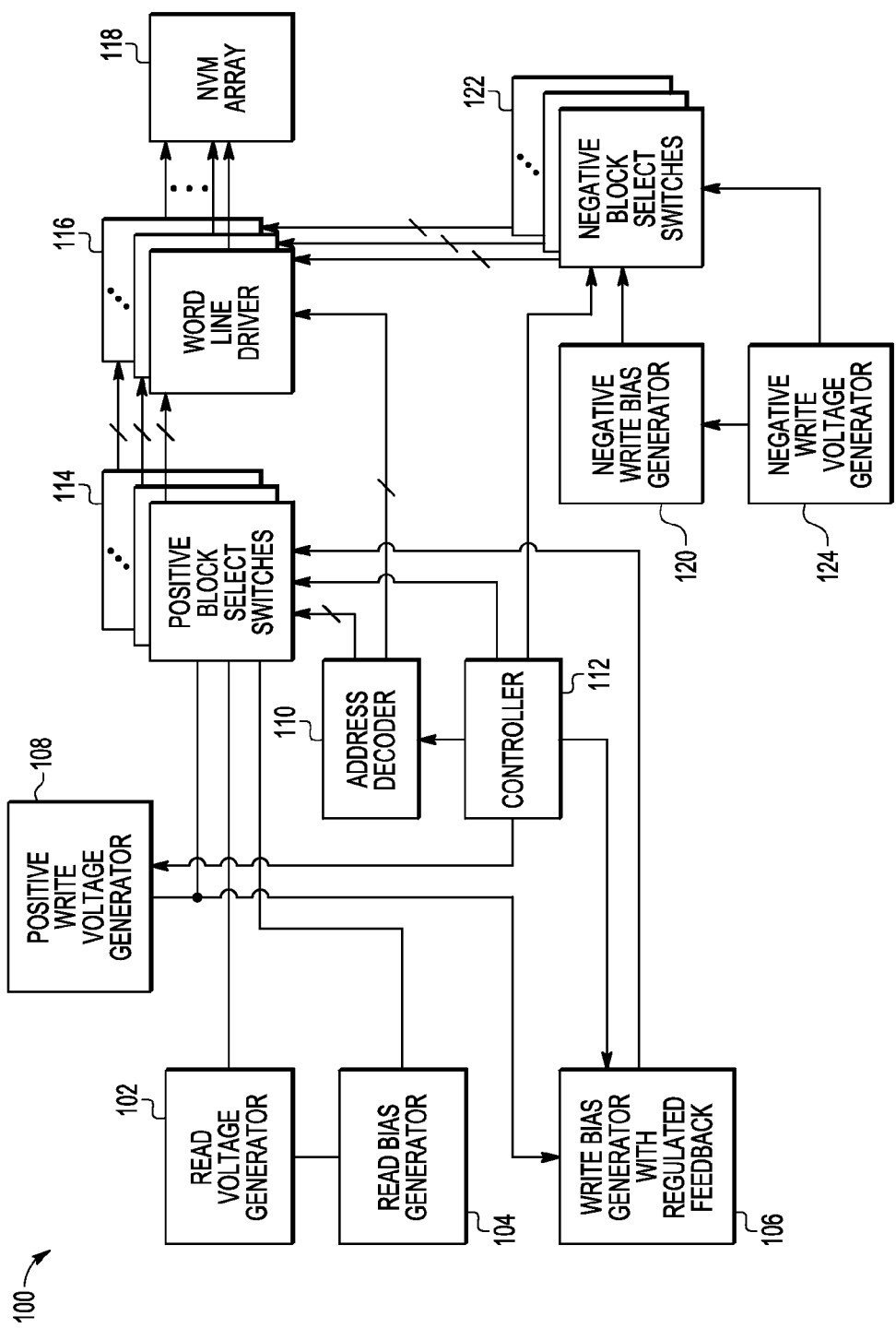
FIG. 1 is a block diagram of an embodiment of a non-volatile memory (NVM) device in accordance with the present disclosure.

FIG. 1 is a block diagram of an embodiment of a non-volatile memory (NVM) device 100 in accordance with the present disclosure including read voltage generator or node 102, read bias generator or node 104, write bias generator or node with regulated feedback 106, positive write voltage generator or node 108, address decoder 110, controller 112, positive block select switches 114, word line drivers 116, non-volatile memory array 118, negative write bias generator or node 120, negative block select switches 122, and negative write voltage generator or node 124.

Read voltage generator 102 is coupled to supply read voltage to read bias generator 104 and positive block select switches 114. Read voltage generator 102 may be implemented using a charge pump or other suitable device.

Read bias generator 104 is coupled to supply a read bias voltage to positive block select switches 114.

Write bias generator with regulated feedback 106 is coupled to supply a write bias signal to positive block select switches 114 and to receive a positive write voltage from positive write voltage generator 108 and control signals from controller 112.

Positive write voltage generator 108 is coupled to provide positive write voltage from positive write voltage generator 108 and to receive control signals from controller 112. Positive write voltage generator 108 may be implemented using a charge pump, a linear regulator, or other suitable device.

Address decoder 110 receives control signals from controller 112 and supplies row and column selection signals to positive block select switches 114 and word line driver 116.

Controller 112 provides control signals to positive write voltage generator 108, positive block select switches 114, negative block select switches 122, write bias generator with regulated feedback 106, and address decoder 110.

Positive block select switches 114 are coupled to receive a read voltage from read voltage generator 102, read bias voltage from read bias generator 104, a positive write voltage from positive write voltage generator 108, control signals from controller 112, row and column selection signals from address decoder 110, and write bias voltage from write bias generator with regulated feedback 106. Positive block select switches 114 are coupled to provide positive block select signals such as positive write bias voltage and positive write voltage during write operation, and read voltage and read bias voltage during read operation, to word line driver 116.

Word line drivers 116 receive positive block select signals from positive block select switches 114 and negative block select signals from negative block select switches 122. Word line drivers 116 supply word line signals to corresponding groups or blocks of memory cells in NVM array 118.

Non-volatile memory array 118 is an array of memory cells arranged in rows and columns of memory cells. The memory cells can be implemented with MOSFET transistors including one current terminal coupled to a bitline or column driver signal, a second current terminal coupled to ground or negative voltage, and a control gate coupled to a word line or row driver signal. Each individual memory cell can be addressed by selecting a corresponding row and column in the array. Subsets of the memory cells can be grouped in blocks and each block can be selected independent of other blocks for memory operations such as block erase.

Negative write bias generator 120 receives a negative write voltage from negative write voltage generator 124 and provides a negative write bias voltage to negative block select switches 122.

Negative block select switches 122 receive control signals from controller 112, negative write voltage from negative write voltage generator 124, and negative write bias voltage from negative write bias generator 120, and provide block select signals to each of word line drivers 116.

Negative write voltage generator 124 provides a negative write voltage to negative write bias generator 120 and negative block select switches 122. Negative write voltage generator 124 may be implemented using a charge pump, a linear regulator, or other suitable device.

During write operations, write bias generator with regulated feedback 106 generates a write bias voltage that is used to reduce current drawn by the word line driver circuit 116.

The reduction in current during setup time for write operations allows the word line voltage to be selected faster by the block select switches 114, 122, thus improving performance of NVM device 100.

Figure 2:
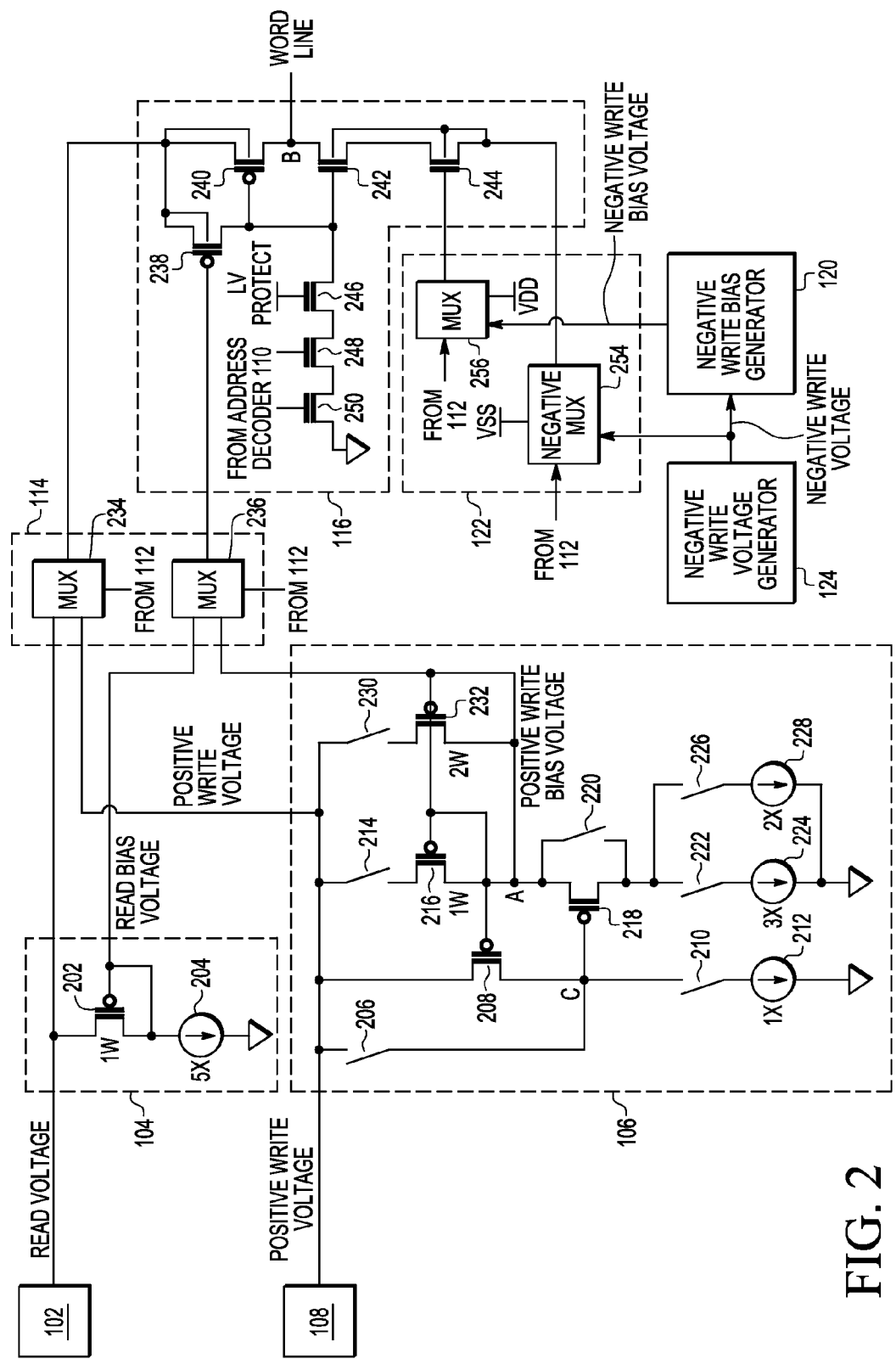
FIG. 2 is a schematic diagram showing embodiments of various circuits that can be used in the NVM device of FIG. 1.

FIG. 2 is a schematic diagram showing embodiments of circuits that can be used to implement various components in the NVM device of FIG. 1. An example of read bias generator 104 includes P-channel transistor 202 configured as a diode with a source or current terminal coupled to receive a read voltage from read voltage generator 102, a drain or current terminal coupled to a first terminal of current source 204 and a control gate or terminal coupled to the drain terminal. A second terminal of current source 204 is coupled to ground. The control gate of transistor 202 is coupled to a first input to a first multiplexer 236 in positive block select switches 114.

An example of positive block select switches 114 includes first multiplexer or selection circuit 234 and second multiplexer or selection circuit 236. First multiplexer 234 is coupled to receive read voltage from read voltage generator 102 and positive write voltage from positive write voltage generator 108. Second multiplexer 236 is coupled to receive a read bias voltage from the control gate of transistor 202 and write bias voltage from write bias generator with regulated feedback 106. Respective control signals coupled to select between inputs to multiplexers 234, 236 are provided by controller 112 (FIG. 1). During read operations, the read voltage and read bias voltage are selected as outputs of respective multiplexers 234, 236. During write operations, positive write voltage and positive write bias voltage are selected as outputs of respective multiplexers 234, 236.

An example of write bias generator with regulated feedback 106 includes switch 206, P-channel transistor 208, switch 210, current source 212, switch 214, P-channel transistor 216, P-channel transistor 218, switch 220, switch 222, current source 224, switch 226, current source 228, switch 230, and p-channel transistor 232. P-channel transistors 208 and 218, switches 210, 214, 220, and current source 212 are configured as a regulated cascode circuit. P-channel transistor 208 has a source terminal coupled to positive write voltage generator 108, a drain terminal couplable to a first terminal of current source 212 via switch 210, and a gate terminal coupled between the drain terminal of P-channel transistor 216 and the source terminal of transistor 218.

Switch 206 is coupled between Node C and positive write voltage generator 108. One terminal of switch 206, the gate of transistor 218, the drain terminal of transistor 208, and one terminal of switch 210 are connected to Node C. The source terminal of transistor 218 is coupled to the drain terminal of transistor 216. The source terminal of transistor 218 can also be coupled to a drain terminal of transistor 218 via switch 220. The drain terminal of transistor 218 is also couplable to a first terminal of current sources 224, 228 via respective switches 222, 226. Switch 222 and current source 224 are connected in parallel to switch 226 and current source 228. Second terminals of switches 224, 228 are coupled to a common ground.

Transistor 216 is configured as a diode with a source terminal coupled to positive write voltage generator 108 and a gate terminal coupled to a drain terminal of transistor 216. The drain terminal of transistor 216 is coupled to the source terminal of transistor 218. The gate terminal of transistor 216 is also coupled to a gate terminal of transistor 232.

Transistor 232 has a source terminal coupled to positive write voltage generator 108 and a gate terminal coupled to the gate terminal of transistor 216. A drain terminal of transistor 232 is coupled to a positive write bias voltage signal that is output between the drain terminal of transistor 216 and the source terminal of transistor 218.

An example of one of word line drivers 116 as shown in FIG. 2 includes P-channel transistors 238, 240 and N-channel transistors 242, 244, 246, 248, 250. Source terminals of P-channel transistors 238, 240 are coupled each other and to the output of multiplexer 234. A drain terminal of transistor 238 is coupled to a drain terminal of transistor 246 and to gate terminals of transistors 240 and 242. A gate terminal of transistor 238 is coupled to the output of multiplexer 236. Substrate bodies of transistors 238, 240 are coupled to one another and to the source terminal of transistor 240.

Transistors 242 and 244 are coupled in series with each other and with transistor 240. A drain terminal of transistor 240 is coupled to a drain terminal of transistor 242. A source terminal of transistor 242 is coupled to a drain terminal of transistor 244. A source terminal of transistor 244 is coupled to the output of negative multiplexer 254 in negative block select switches 122.

A gate terminal of transistor 242 is coupled to the drain terminal of transistor 246. A gate terminal of transistor 244 is coupled to the output of multiplexer or selection circuit 256 in negative block select switches 122. Substrate bodies of transistors 242, 244 are coupled to one another and to the source terminal of transistor 244.

Transistors 246-250 are coupled in series with a source terminal of transistor 246 coupled to a drain terminal of transistor 248. A source terminal of transistor 248 is coupled to a drain terminal of transistor 250. A source terminal of transistor 250 is coupled to ground. A gate terminal of transistor 246 is coupled to a low voltage protect signal that is output by a low voltage protect bias generator (not shown). The low voltage protect signal is used to control transistor 246 to protect transistors 248 and 250 from high positive voltages. Gate terminals of transistors 248, 250 are coupled to address decode signals from address decoder 110.

A word line signal is output between the drain terminal of transistor 240 and the drain terminal of transistor 242.

An example of one of negative block select switches 122 as shown in FIG. 2 includes negative multiplexer or selection circuit 254 and multiplexer 256. Negative multiplexer 254 has a first input coupled to a first supply voltage shown as Vss and a second input coupled to the output of negative write voltage generator 124. The output of negative multiplexer 254 is coupled to the source terminal of transistor 244. Multiplexer 256 has a first input coupled to a second supply voltage shown as VDD and a second input coupled to the output of negative write bias generator 120. The voltage VDD is greater than the voltage VSS. VSS may be at ground or negative reference voltage. The output of multiplexer 256 is coupled to the gate terminal of transistor 244. Negative multiplexer 254 and multiplexer 256 receive respective control inputs from controller 112.

In the embodiment shown, the size of transistor 232 is twice the size of transistors 216. The size of transistor 216 is same as the size of the transistor 238. The amount of current drawn by current source 224 is three times the amount of current drawn by current source 212 and the amount of current drawn by current source 228 is twice the amount of current drawn by current source 212. Transistors 208 and 218 can have any suitable sizes.

Switches 206, 210, 214, 220, 222, 226, and 230 are set by controller 112 to configure write bias generator 106 to generate positive write bias voltages for write operations and read bias voltages for read recovery operations. Negative write bias generator 120 is used to generate negative write bias voltages for certain write operations such as soft program, soft program verify, and erase verify. Switch 206 can be closed to disable and safe state the write bias generator circuit when not in write or read recovery mode. When switch 206 is closed, switches 210 and 222 will be open to turnoff respective current sources 212 and 224.

Referring to FIGS. 2 and 3, FIG. 3 is a schematic diagram showing a configuration of positive write bias voltage generator circuit 106 of FIG. 2 during positive write mode of operation during which selected memory cells are programmed. Switches 210, 214, 222 and 230 are closed (conducting mode) and switches 206 and 226 are open (non-conducting mode). During positive write operations, multiplexers 234, 236 will output positive write voltage and positive write bias voltage, respectively. Positive write voltage goes to word line supply node B (FIG. 2) and positive write bias voltage goes to transistor 238. The relation between positive write voltage and positive write bias voltage is regulated by write bias generator 106 so that current at word line node B will be at level required for word line selection. Positive write voltage can range from 2 to 9 volts, for example, and write bias voltage is regulated so that the current level at transistor 240 quickly and accurately follows the write voltage. Current sources 212, 224 are sized to provide bias voltage required to match voltage required by word line driver 116.

During a write operation, write voltage is pumped high and non-conducting transistor 218 decouples current source 224 from bias node A. As the write voltage increases, the gate-source voltage of transistor 208 causes transistor 208 to become conductive, pulling voltage at node C higher while a limited amount of current is discharged through current source 212. The voltage at bias node A increases and follows the write voltage through the gated diodes (transistors) 216 and 232. Transistor 232 has twice the gate width of transistor 216 and thus allows more current to flow, thus pulling up the write bias voltage quickly to follow the write voltage level. When the voltage at bias node A reaches a predetermined level, transistors 208, 216 and 232 become non-conductive, leaving the voltage at bias node A at a predetermined level. When the positive write voltage rises above a threshold level, transistor 218 starts conducting and discharges the voltage at bias node A. When the voltage at bias node A discharges below a threshold level, transistors 208, 216 and 232 become conductive. Transistors 208 and 218 thus regulate the level of write bias voltage that is provided at transistor 238 of the word line driver 116 during positive write operations.

As an additional feature, an address decoding path including transistors 248 and 250 in word line driver 116 opposes the positive write bias voltage on the target word line driver so that the target word line can be readily selected. Word line driver 116 also acts as a level shifter. Decode operation is at logic level at 1.2 Volts, but the word line may be driven at a much higher voltage, such as up to 9 Volts, for example, based on the level of positive write voltage.

Once a positive write operation is complete, NVM device 100 can be reconfigured to recover voltages to perform a read operation. Referring to FIGS. 2 and 4, FIG. 4 is a schematic diagram showing a configuration of a positive write bias voltage generator circuit 106 of FIG. 2 during a read recovery mode of operation. Switches 214, 220, 222, and 226 are closed (conducting mode) and switches 206, 210 and 230 are open (non-conducting mode) leaving gated diode (transistor) 216 coupled between positive write voltage generator 108 and parallel current sources 224, 228. During read recovery, the positive write voltage and positive write bias voltages are brought to read voltage levels. The size of current source 204 is approximately the same size as the sum of current sources 224 and 228 and the size of diode configured transistor 202 is approximately the same size as diode configured transistor 216. Current sources 224, 228 cause gated diode 216 to have a read bias current level to match voltages at select word line driver 116 to read voltage levels. For example, a read voltage can be set at 4.5 Volts and bias current can be set to approximately 40 microamps.

Figure 5:
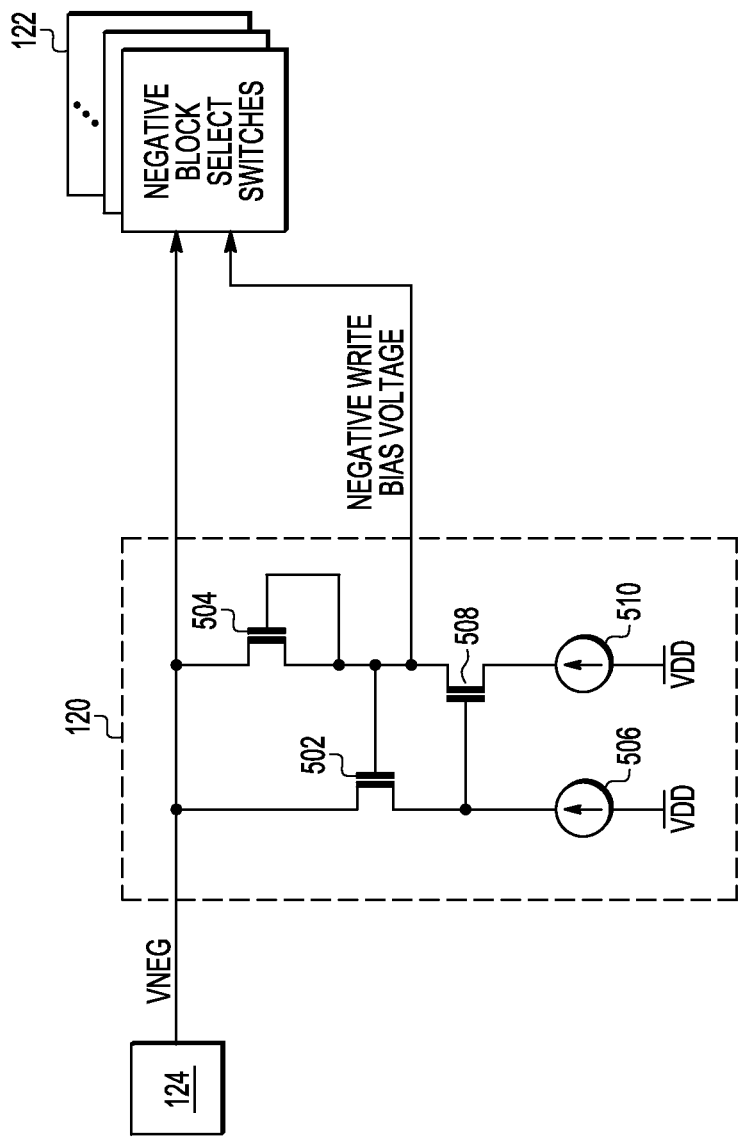
FIG. 5 is a schematic diagram showing an embodiment of a negative write bias voltage generator circuit of FIG. 2.

FIG. 5 is a schematic diagram showing an embodiment of a negative write bias voltage generator circuit 120 of FIG. 2. The gate of transistor 244 in word line driver 116 receives either negative write bias voltage or VDD from multiplexer 256 in negative block switch 122. The source of transistor 244 receives either VSS or negative write voltage from negative multiplexer 254. During negative write operations such as soft program, soft program verify, and erase verify, a negative deselect voltage at word line node B may be at minus 4.5 Volts, for example. During read and positive write operations, multiplexer 254 operates to output VSS to the source of transistor 244 and multiplexer 256 operates to output VDD to the gate of transistor 244. During negative write operations, multiplexer 254 operates to output negative write voltage to the source of transistor 244 and multiplexer 256 operates to output negative write bias voltage to the gate of transistor 244. The bias of transistor 244 provided by multiplexer 256 facilitates the voltage at word line node B to be at the required level to deselect the corresponding word line during negative write operations.

By now it should be appreciated that in some embodiments, there has been provided a memory comprising a word line driver circuit, a write voltage generator for providing a write voltage to the word line driver during a write operation to memory cells coupled to the word line driver circuit, and a write bias generator including an output node for providing a write bias voltage that is different from the write voltage to the word line driver circuit during a write operation to memory cells coupled to the word line driver circuit. The write bias voltage is used to reduce current drawn by the word line driver circuit from the write voltage generator during a write operation to memory cells coupled to the word line driver circuit. The write bias generator can include a diode configured transistor including a first current terminal for receiving the write voltage and a second current terminal connected to the output node, a first transistor having a first current terminal connected to the output node, a second current terminal, and a control terminal, and a second transistor having a first current terminal for receiving the write voltage, a second current terminal connected to the control terminal of the first transistor, and a control terminal connected to the output node. During a write mode, the conductivity of the second transistor controls the conductivity of the first transistor for regulating the voltage of the output node.

In another aspect, the write bias generator can further comprise a current source, wherein during a write mode, the conductivity of the first transistor is controlled to control the amount of current flowing through the first transistor between the output node and the current source.

In another aspect, the memory can further comprise a second current source located in parallel with the current source, wherein during a read recovery mode, the second current source provides current to the second current terminal of the diode connected transistor in parallel with the first current source, wherein during a write mode, the second current source is not utilized.

In another aspect, the memory can further comprise a second current source, the second current source can provide current to the second current terminal of the second transistor during a write mode.

In another aspect, the second current source may not be utilized in providing a voltage at the output node during a write mode.

In another aspect, the write bias generator can further include a second diode configured transistor located in parallel with the first diode configured transistor. The second diode configured transistor can include a first current terminal for receiving the write voltage during a write operation and a second current terminal connected to the output node.

In another aspect, the second diode configured transistor may not be utilized in providing a voltage at the output node during a read recovery mode.

In another aspect, during a read recovery mode, the second transistor may not be utilized in controlling the voltage of the output node.

In another aspect, the memory can further comprise a read bias generator, the read bias generator including a second diode configured transistor having a first current terminal for receiving a read voltage and a second current terminal configured to provide a read bias voltage. The diode configured transistor can be approximately the same size as the second diode configured transistor.

In another aspect, the memory can further comprise a read bias generator that includes a second diode configured transistor having a first current terminal for receiving a read voltage and a second current terminal configured to provide a read bias voltage. The write bias generator can further comprise a first current source. During a write mode, the conductivity of the first transistor can be controlled to control the amount of current flowing through the first transistor between the output node and the first current source. The read bias generator can further comprise a second current source coupled to the second current terminal of the second diode configured transistor. The first current source can be sized to provide less current than the second current source.

In another aspect, the memory can further comprise a third current source located in parallel with the first current source. During a read recovery mode, the third current source provides current to second current terminal of the diode connected transistor in parallel with the first current source. During a write mode, the third current source may not be utilized In another aspect, the first current source and the third current source can be sized together to provide approximately the same amount of current as the second current source.

In another aspect, the memory can further comprise a read bias generator, the read bias generator including an output node for providing a read bias voltage, and selection circuit having a first input coupled to the output node of the write bias generator and a second input coupled to the output node of the read bias generator. The selection circuit can have an output coupled to a control terminal of the word line driver circuit. The control terminal can be used to reduce current drawn by the word line driver circuit during an operation to memory cells coupled to the word line driver circuit.

In another aspect, the memory can further comprise a read voltage generator to provide a read voltage and a second selection circuit having a first input coupled to the write voltage generator and a second input coupled to the read voltage generator. The output of the second selector circuit can provide a voltage for biasing a word line connected to the output of the word line driver circuit during a memory operation of the memory.

In another aspect, during a write to memory cells coupled to the word line driver circuit, the output node of the write bias generator provides the write bias voltage and the selection circuit couples its first input to its output, after the write operation, the write bias generator enters a read recovery mode where the voltage of the write bias voltage is moved to a voltage approximately equal to a voltage of the output node of the read bias generator, after the voltage of the output node of the write bias generator approximately equals the voltage of the output node of the read bias generator, the selection circuit couples its second input to its output.

In another aspect, the write voltage generator can be a positive voltage node and the output of the write bias generator can provide a positive write bias voltage during a write operation. The memory can further comprise a negative write voltage generator and a negative a write bias generator including an output node for providing a negative write bias voltage that is different from the negative write voltage to the word line driver circuit during a write operation to memory cells coupled to the word line driver circuit. The negative write bias voltage can be used to reduce current drawn by the word line driver circuit from the negative write voltage generator during a write operation to memory cells coupled to the word line driver circuit.

In another aspect, the negative write bias generator can include a second diode configured transistor including a first current terminal for receiving the negative write voltage and a second current terminal connected to the output node of the negative write bias generator, a third transistor having a first current terminal connected to the output node of the negative write bias circuit, a second current terminal, and a control terminal, and a fourth transistor having a first current terminal for receiving the negative write voltage, a second current terminal connected to the control terminal of the third transistor, and a control terminal connected to the output node of the negative write bias circuit. During a write mode, the conductivity of the fourth transistor can control the conductivity of the third transistor for regulating the voltage of the output node of the negative write bias generator.

In another aspect, the memory can further comprise a plurality of word line driver circuits. For each word line driver circuit of the plurality, the write voltage generator can provide a write voltage to a word line driver circuit of the plurality during a write operation to memory cells coupled to the word line driver circuit of the plurality. For each word line driver circuit of the plurality, the output node can provide a write bias voltage to a word line driver circuit of the plurality during a write operation to memory cells coupled to the word line driver circuit of the plurality. The write bias voltage is used to reduce current drawn by the word line driver circuit of the plurality from the write voltage generator during a write operation to memory cells coupled to the word line driver circuit of the plurality.

In yet another embodiment, a method of operating a word line driver can comprise performing a write operation to memory cells coupled to a word line driver. The performing a write operation can include providing a write voltage to the word line driver from an output of a write voltage generator, and providing a write bias voltage to the word line driver from an output of a write bias generator. The word line driver can use the write bias voltage to reduce current drawn by the word line driver circuit from the write voltage generator output during the write operation to the memory cells coupled to the word line driver circuit. Providing the write bias voltage can include the write bias generator receiving the write voltage from the output of the write voltage generator and using a first transistor and second transistor in generating the write bias voltage from the write voltage and operating in a read recovery mode following the write operation. Operating in a read recovery mode can include receiving, by the write bias generator, a voltage from the output of the write voltage generator, using, by the write bias generator, the voltage provided by the output of the write voltage generator to generate a bias voltage at the output of the write bias generator without the use of the first transistor and the second transistor.

In another embodiment, operating in the read recovery mode can include initially providing the voltage of the output of the write bias generator to a terminal of the word line driver, matching the voltage of the output to the write bias generator to a voltage of an output of a read bias generator, matching the voltage of the output of the write voltage generator to a voltage of an output of a read voltage generator, and after the matching and the matching, providing the voltage of the output of the read bias generator to the terminal of the word line driver.

In another aspect, the first transistor can have a first current terminal connected to the output of the write bias generator. Using a first transistor and second transistor in generating the write bias voltage from the write voltage can include receiving the write voltage by a first current terminal of a second transistor. A second current terminal of the second transistor can be connected to a control terminal of the first transistor and a control terminal of the second transistor can be connected to the output of the write bias generator. The voltage of the output of the write bias generator can be regulated by using the conductivity of the second transistor to control the conductivity of the first transistor.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   a word line driver circuit;
   a write voltage generator for providing a write voltage to the word line driver during a write operation to memory cells coupled to the word line driver circuit;
   a write bias generator including an output node for providing a write bias voltage that is different from the write voltage to the word line driver circuit during a write operation to memory cells coupled to the word line driver circuit, wherein the write bias voltage is used to reduce current drawn by the word line driver circuit from the write voltage generator during a write operation to memory cells coupled to the word line driver circuit, wherein the write bias generator includes:
   a diode configured transistor including a first current terminal for receiving the write voltage and a second current terminal connected to the output node;
   a first transistor having a first current terminal connected to the output node, a second current terminal, and a control terminal;
   a second transistor having a first current terminal for receiving the write voltage, a second current terminal connected to the control terminal of the first transistor, and a control terminal connected to the output node, wherein during a write mode, the conductivity of the second transistor controls the conductivity of the first transistor for regulating the voltage of the output node.

2. The memory of claim 1 wherein the write bias generator further comprises a current source, wherein during a write mode, the conductivity of the first transistor is controlled to control the amount of current flowing through the first transistor between the output node and the current source.

3. The memory of claim 2 further comprising a second current source located in parallel with the current source, wherein during a read recovery mode, the second current source provides current to the second current terminal of the diode connected transistor in parallel with the first current source, wherein during a write mode, the second current source is not utilized.

4. The memory of claim 2 further comprising a second current source, the second current source providing current to the second current terminal of the second transistor during a write mode.

5. The memory of claim 4 wherein the second current source is not utilized in providing a voltage at the output node during a write mode.

6. The memory of claim 1 wherein the write bias generator further includes a second diode configured transistor located in parallel with the first diode configured transistor, wherein the second diode configured transistor includes a first current terminal for receiving the write voltage during a write operation and a second current terminal connected to the output node.

7. The memory of claim 6 wherein the second diode configured transistor is not utilized in providing a voltage at the output node during a read recovery mode.

8. The memory of claim 1 wherein during a read recovery mode, the second transistor is not utilized in controlling the voltage of the output node.

9. The memory of claim 1 further comprising a read bias generator, the read bias generator including a second diode configured transistor having a first current terminal for receiving a read voltage and a second current terminal configured to provide a read bias voltage, wherein the diode configured transistor is approximately the same size as the second diode configured transistor.

10. The memory of claim 1 further comprising:
a read bias generator, the read bias generator including a second diode configured transistor having a first current terminal for receiving a read voltage and a second current terminal configured to provide a read bias voltage;
the write bias generator further comprises a first current source, wherein during a write mode, the conductivity of the first transistor is controlled to control the amount of current flowing through the first transistor between the output node and the first current source;
the read bias generator further comprises a second current source coupled to the second current terminal of the second diode configured transistor;
wherein the first current source is sized to provide less current than the second current source.

11. The memory of claim 10 further comprising a third current source located in parallel with the first current source, wherein during a read recovery mode, the third current source provides current to second current terminal of the diode connected transistor in parallel with the first current source, wherein during a write mode, the third current source is not utilized.

12. The memory of claim 11 wherein the first current source and the third current source are sized together to provide approximately the same amount of current as the second current source.

13. The memory of claim 1 further comprising:
a read bias generator, the read bias generator including an output node for providing a read bias voltage;
a selection circuit having a first input coupled to the output node of the write bias generator and a second input coupled to the output node of the read bias generator, the selection circuit having an output coupled to a control terminal of the word line driver circuit, the control terminal is used to reduce current drawn by the word line driver circuit during an operation to memory cells coupled to the word line driver circuit.

14. The memory of claim 13 further comprising:
a read voltage generator to provide a read voltage;
a second selection circuit having a first input coupled to the write voltage generator and a second input coupled to the read voltage generator, wherein the output of the second selector circuit provides a voltage for biasing a word line connected to the output of the word line driver circuit during a memory operation of the memory.

15. The circuit of claim 13 wherein during a write to memory cells coupled to the word line driver circuit, the output node of the write bias generator provides the write bias voltage and the selection circuit couples its first input to its output, after the write operation, the write bias generator enters a read recovery mode where the voltage of the write bias voltage is moved to a voltage approximately equal to a voltage of the output node of the read bias generator, after the voltage of the output node of the write bias generator approximately equals the voltage of the output node of the read bias generator, the selection circuit couples its second input to its output.

16. The memory of claim 1 wherein the write voltage generator is a positive voltage node and the output of the write bias generator provides a positive write bias voltage during a write operation, the memory further comprising:
a negative write voltage generator;
a negative a write bias generator including an output node for providing a negative write bias voltage that is different from the negative write voltage to the word line driver circuit during a write operation to memory cells coupled to the word line driver circuit, wherein the negative write bias voltage is used to reduce current drawn by the word line driver circuit from the negative write voltage generator during a write operation to memory cells coupled to the word line driver circuit.

17. The memory of claim 16 wherein the negative write bias generator includes:
a second diode configured transistor including a first current terminal for receiving the negative write voltage and a second current terminal connected to the output node of the negative write bias generator;
a third transistor having a first current terminal connected to the output node of the negative write bias circuit, a second current terminal, and a control terminal;
a fourth transistor having a first current terminal for receiving the negative write voltage, a second current terminal connected to the control terminal of the third transistor, and a control terminal connected to the output node of the negative write bias circuit, wherein during a write mode, the conductivity of the fourth transistor controls the conductivity of the third transistor for regulating the voltage of the output node of the negative write bias generator.

18. The memory of claim 1 further comprising:
a plurality of word line driver circuits, for each word line driver circuit of the plurality, the write voltage generator provides a write voltage to a word line driver circuit of the plurality during a write operation to memory cells coupled to the word line driver circuit of the plurality;
wherein for each word line driver circuit of the plurality, the output node provides a write bias voltage to a word line driver circuit of the plurality during a write operation to memory cells coupled to the word line driver circuit of the plurality, wherein the write bias voltage is used to reduce current drawn by the word line driver circuit of the plurality from the write voltage generator during a write operation to memory cells coupled to the word line driver circuit of the plurality.

19. A method of operating a word line driver comprising:
performing a write operation to memory cells coupled to a word line driver, the performing a write operation includes:
providing a write voltage to the word line driver from an output of a write voltage generator;
providing a write bias voltage to the word line driver from an output of a write bias generator, wherein the word line driver uses the write bias voltage to reduce current drawn by the word line driver circuit from the write voltage generator output during the write operation to the memory cells coupled to the word line driver circuit, wherein the providing the write bias voltage includes the write bias generator receiving the write voltage from the output of the write voltage generator and using a first transistor and second transistor in generating the write bias voltage from the write voltage;

operating in a read recovery mode following the write operation, the operating in a read recovery mode includes:

receiving, by the write bias generator, a voltage from the output of the write voltage generator;

using, by the write bias generator, the voltage provided by the output of the write voltage generator to generate a bias voltage at the output of the write bias generator without the use of the first transistor and the second transistor.

20. The method claim 19 wherein the operating in the read recovery mode includes:

initially providing the voltage of the output of the write bias generator to a terminal of the word line driver;

matching the voltage of the output to the write bias generator to a voltage of an output of a read bias generator;

matching the voltage of the output of the write voltage generator to a voltage of an output of a read voltage generator;

after the matching and the matching, providing the voltage of the output of the read bias generator to the terminal of the word line driver.

21. The method of claim 19 wherein:

the first transistor has a first current terminal connected to the output of the write bias generator;

the using a first transistor and second transistor in generating the write bias voltage from the write voltage includes:

receiving, by a first current terminal of a second transistor, the write voltage, a second current terminal of the second transistor is connected to a control terminal of the first transistor and a control terminal of the second transistor is connected to the output of the write bias generator, regulating the voltage of the output of the write bias generator, wherein the regulating includes the conductivity of the second transistor controlling the conductivity of the first transistor.

\* \* \* \* \*